United States Patent
Zhou

(10) Patent No.: US 11,587,995 B2
(45) Date of Patent: Feb. 21, 2023

(54) ORGANIC LIGHT EMITTING DIODE DEVICE AND MANUFACTURING METHOD THEREOF, DISPLAY PANEL, AND DISPLAY DEVICE

(71) Applicants: Chengdu BOE Optoelectronics Technology Co., Ltd., Sichuan (CN); BOE Technology Group Co., Ltd., Beijing (CN)

(72) Inventor: Weilong Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/100,174

(22) Filed: Nov. 20, 2020

(65) Prior Publication Data
US 2021/0074782 A1  Mar. 11, 2021

Related U.S. Application Data

(63) Continuation of application No. 16/199,658, filed on Nov. 26, 2018, now abandoned.

(30) Foreign Application Priority Data

Dec. 5, 2017  (CN) .......................... 201711266868.6

(51) Int. Cl.
| | | |
|---|---|---|
| *H01L 27/32* | (2006.01) | |
| *H01L 51/50* | (2006.01) | |
| *H01L 51/52* | (2006.01) | |

(52) U.S. Cl.
CPC ........ *H01L 27/3246* (2013.01); *H01L 27/322* (2013.01); *H01L 27/3248* (2013.01);
(Continued)

(58) Field of Classification Search
CPC ............. H01L 27/3258; H01L 27/3246; H01L 27/322; H01L 51/5209; H01L 51/5225; H01L 51/5275
See application file for complete search history.

(56) References Cited

U.S. PATENT DOCUMENTS

| | | | | |
|---|---|---|---|---|
| 2008/0024402 A1* | 1/2008 | Nishikawa | ............. | H05B 33/22 345/82 |
| 2011/0297943 A1* | 12/2011 | Kim | .................... | H01L 51/5265 438/34 |

(Continued)

FOREIGN PATENT DOCUMENTS

KR    20180125674 A  * 11/2018  ........... H01L 27/323

*Primary Examiner* — Aaron J Gray
(74) *Attorney, Agent, or Firm* — Nath, Goldberg & Meyer; Joshua B. Goldberg

(57) ABSTRACT

The present disclosure provides an organic light emitting diode device and a manufacturing method thereof, a display panel and a display device. The organic light emitting diode device includes: a substrate; and a light emitting component and a first structural layer provided on a side of the substrate, wherein the light emitting component is provided on a side of the first structural layer distal to the substrate, and a light emitting surface of the light emitting component comprises a curved surface recessed towards the substrate, and the curved surface comprises a spherical-cap curved surface or a concave-convex curved surface which is constituted by a plurality of spherical-cap curved surfaces.

18 Claims, 4 Drawing Sheets

(52) U.S. Cl.
CPC ...... *H01L 27/3258* (2013.01); *H01L 51/5016* (2013.01); *H01L 51/5056* (2013.01); *H01L 51/5206* (2013.01); *H01L 51/5209* (2013.01); *H01L 51/5221* (2013.01); *H01L 51/5225* (2013.01); *H01L 51/5262* (2013.01); *H01L 51/5275* (2013.01)

(56) References Cited

U.S. PATENT DOCUMENTS

| | | | | |
|---|---|---|---|---|
| 2014/0312319 | A1* | 10/2014 | Kim | H01L 27/1248 257/40 |
| 2018/0190719 | A1* | 7/2018 | Kim | H01L 27/326 |
| 2018/0331326 | A1* | 11/2018 | Woo | H01L 51/5275 |

* cited by examiner

ORGANIC LIGHT EMITTING DIODE DEVICE AND MANUFACTURING METHOD THEREOF, DISPLAY PANEL, AND DISPLAY DEVICE

CROSS-REFERENCE TO RELATED APPLICATION

This is a Continuation Application of U.S. patent application Ser. No. 16/199,658, filed Nov. 26, 2018, an application claiming the benefit from Chinese Patent Application No. No. 201711266868.6, filed to State Intellectual Property Office of the Republic of China on Dec. 5, 2017, the disclosure of each is hereby incorporated by reference in its entirety.

TECHNICAL FIELD

The present disclosure relates to the field of display technology, in particular, to an organic light emitting diode device and a manufacturing method thereof, a display panel, and a display device.

BACKGROUND

Organic light emitting diode (OLED) device, in which organic materials emit light under an electric field, has characteristics such as a high contrast, a short response time, etc., and is capable of achieving an ultrathin and flexible display.

For the moment, the OLED display technology has a rapid progress. While the users' individualized requirements are satisfied, some problems arise, Since OLEDs achieve self-illumination using organic materials, they generally have shorter service lives, which affects user's experiences badly.

SUMMARY

The present disclosure provides an organic light emitting diode device and a manufacturing method thereof, a display panel, and a display device.

The present disclosure provides an organic light emitting diode device including a substrate, and a light emitting component and a first structural layer provided on a side of the substrate, wherein the light emitting component is provided on a side of the first structural layer distal to the substrate, and a surface area of a light emitting surface of the light emitting component is larger than an area of an orthographic projection of the light emitting component on the substrate.

In a specific embodiment, the light emitting surface of the light emitting component includes a curved surface recessed towards the substrate.

In a specific embodiment, the curved surface includes a spherical-cap curved surface or a concave-convex curved surface which is constituted by a plurality of spherical-cap curved surfaces.

In a specific embodiment, a radius of a bottom circle of the spherical cap is r, a height of the spherical cap is H, wherein arctan(H/r) is an angle ranging from about 20° to about 40°.

In a specific embodiment, a surface of the first structural layer proximal to the light emitting component and a surface of the light emitting component proximal to the first structural layer have a same shape and are in contact with each other.

In a specific embodiment, a thickness of the first structural layer in a direction perpendicular to the substrate ranges from about 1 μm to about 4 μm.

In a specific embodiment, the first structural layer is a planarization layer, a pixel definition layer is further provided at the side of the first structural layer distal to the substrate, wherein an orthographic projection of the pixel definition layer on the substrate does not overlap with an orthographic projection of the light emitting component on the substrate, the pixel definition layer includes a plurality of pixel definition structures, the light emitting component is provided between adjacent pixel definition structures, and a region between the adjacent pixel definition structures defines the area of the orthographic projection of the light emitting component on the substrate.

In a specific embodiment, the organic light emitting diode device is of a top-emission type, an encapsulation layer is further provided on a side of the pixel definition structure distal to the substrate, and spacers are provided between the pixel definition structure and the encapsulation layer.

In a specific embodiment, the light emitting component includes a cathode, an anode, and an organic light emitting material layer between the cathode and the anode.

In a specific embodiment, the light emitting component further comprises a hole injection layer, a hole transport layer, an electron transport layer and an electron injection layer.

In a specific embodiment, a thin film transistor (TFT) is provided between the light emitting component and the substrate, the TFT includes an active layer, a gate, a source and a drain, and the drain is coupled to the anode.

In a specific embodiment, a light adjustment component is provided at a side of the light emitting component distal to the substrate, and the light adjustment component is configured to convert light emitted from the light emitting component into parallel light, and to emit the parallel light out.

In a specific embodiment, the organic light emitting diode device is of a top-emission type, an encapsulation layer is further provided on a side of the pixel definition structures distal to the substrate, and spacers are provided between the pixel definition structures and the encapsulation layer, a light adjustment component is provided inside of the light emitting component, the light adjustment component is configured to convert light emitted from the light emitting component into parallel light, and to emit the parallel light out.

In a specific embodiment, the light adjustment component includes a lens.

The present disclosure further provides a manufacturing method of an organic light emitting diode device including steps of:

forming a first structural layer on a side of a substrate; and forming a light emitting component on a side of the first structural layer distal to the substrate;

wherein a surface area of a light emitting surface of the light emitting component is larger than an area of an orthographic projection of the light emitting component on the substrate.

According to an embodiment of the present disclosure, the step of forming the first structural layer includes:

forming a planarization layer on a side of a substrate; and forming a curved surface recessed towards the substrate on a side of the planarization layer distal to the substrate, to obtain the first structural layer.

The present disclosure further provides a display panel which includes the above organic light emitting diode device.

The present disclosure further provides a display device which includes the above display panel.

DETAILED DESCRIPTION

The present disclosure will be further described below in conjunction with the drawings and the specific implementations in order that a person skilled in the art can understand the present disclosure better.

In the related technology, a lifetime of an OLED may be increased by reduction of the current density due to increasing of an aperture ratio (which is a ratio of an area of a pixel region to an area of a screen display region). However, owing to the limitation of the process conditions, the intended increasing of aperture ratio may lower the product yield.

Figure 1:
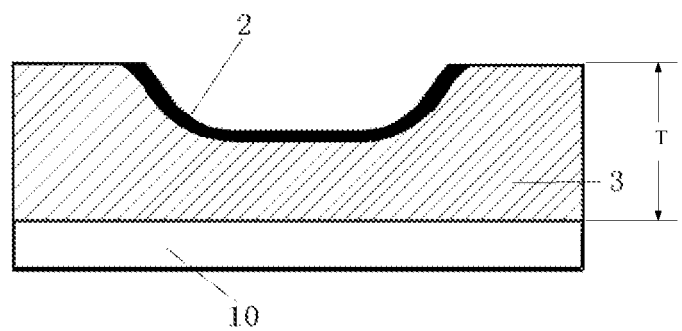
FIGS. 1 to 4 are schematic diagrams of structures of organic light emitting diode devices according to embodiments of the present disclosure.

The present embodiment provides an organic light emitting diode device which, as shown in FIG. 1, includes a substrate 10, and a first structural layer 3 and a light emitting component 2 which are provided on a same side of the substrate 10. The light emitting component 2 is provided on a side of the first structural layer 3 facing away from the substrate 10, wherein a surface area of a light emitting surface of the light emitting component 2 is larger than an area of an orthographic projection of the light emitting component 2 on the substrate 10.

The light emitting component 2 of the organic light emitting diode device of the present embodiment is of a non-planar structure, and the surface area of the light emitting surface thereof is larger than the area of the orthographic projection thereof on the substrate 10. Compared to the prior art, the current density of the light emitting component 2 is reduced, since the surface area of the light-emitting region of the light emitting component is increased while a pixel aperture ratio of an OLED display region (the pixel aperture ratio particularly refers to a ratio of the area of the orthographic projection of the light emitting component 2 on the substrate 10 to an area of a whole sub-pixel) remains unchanged (i.e., the product yield of OLEDs is ensured); thereby improving the lifetime of the LED significantly.

According to an embodiment of the present disclosure, a surface of the first structural layer 3 proximal to the light emitting component 2 and a surface of the light emitting component 2 proximal to the first structural layer 3 have a same shape and are in contact with each other, FIG. 1, which corresponds to the present embodiment, shows that: the first structural layer 3 is provided on a side of the substrate 10; the first structural layer 3 is similar to an planarization layer in the related art, and the difference therebetween is only in that: a portion of the first structural layer 3, Which is provided on a side of the first structural layer 3 distal to the substrate 10, and corresponds to the light emitting component 2, is of a non-planar structure. The light emitting component 2 is provided on a side of the first structural layer 3 distal to the substrate, and their surfaces facing to each other are in contact with and bonded to each other. The first structural layer 3 can play following roles. One of the roles is to support the non-planar light emitting component 2. Specifically, respective functional layers of the light emitting component 2 are formed on the first structural layer 3 as a supporter. In this way, the process of manufacturing the light emitting components 2 is facilitated and the product yield is improved, Another role is as follows: since the first structural layer 3 serves as a supporter of the light emitting component 2 and may be of a concave structure, the concave structure may define the shape of the light emitting component 2. In other words, a boundary of the concave structure of the first structural layer 3 may define a boundary of light emitting pixel. In some implementations, a thickness T of the first structural layer 3 ranges from about 1 μm to about 4 μm. In some implementations, a distance from a surface of the first structural layer 3 furthest from the substrate to a surface opposite thereto ranges from about 1 μm to about 4 μm. In a case where the thickness T is larger than 4 μm, the thickness of the product may be thickened. In a case where the thickness T is smaller than 1 μm, it is not conductive to form the non-planar structural corresponding to the light emitting component 2.

Figure 2:
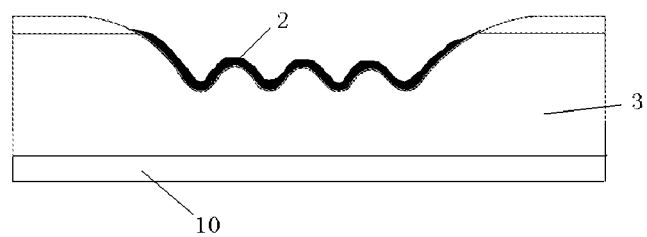

In an embodiment of the present disclosure, the light emitting surface of the light emitting component 2 includes a curved surface recessed towards to the substrate 10. FIG. 1, which corresponds to the present embodiment, shows that: a portion, corresponding to the light emitting component 2, of the surface of the first structural layer 3 distal to the substrate 10 has a concave structure, i.e., it is recessed downwards, and the light emitting component 2 is formed on the basis of the concave structure. In an embodiment of the present disclosure, the curved surface includes a spherical-cap curved surface, or a concave-convex curved surface which is constituted by a plurality of continuous spherical-cap curved surfaces. FIG. 2, which corresponds to the present embodiment, shows that the light emitting surface of the light emitting component 2 is of a wavy shape.

Thus it can be seen that a surface area S' of the light emitting component 2 is larger than an area S0 of the orthographic projection of the light emitting component 2 on the substrate 10. That is to say, compared with the prior art, the area S0 of the orthographic projection of the light emitting component 2 may not be changed. Meanwhile, since the lifetime t of the OLED is in proportion to $1/(j*n)$ (wherein, n is an acceleration factor and generally ranges from about 1.2 to about 1.9; j is a current density), the smaller the current density j is, the longer the lifetime t of the OLED becomes. In the present embodiment, the current density j is decreased by increasing the surface area. S' of the light emitting surface of the light emitting component for a pixel, and thereby increasing the lifetime t of the OLED.

Figure 3:
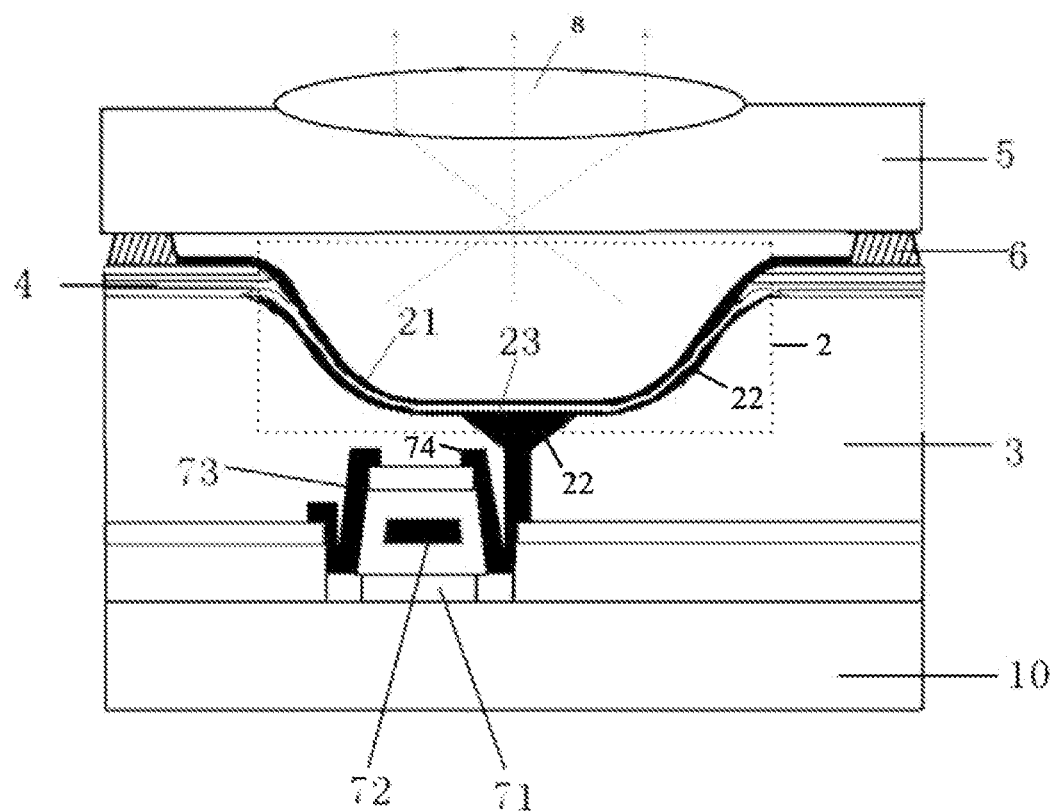

In an embodiment of the present embodiment, as shown in FIG. 3, the first structural layer 3 may be a planarization layer, and a pixel definition layer (PDL) is further provided at the side of the first structural layer 3 distal to the substrate 10, wherein the pixel definition layer is provided on a portion of the first structural layer 3 except for the concave structure thereof (that is, an orthographic projection of the pixel definition layer on the substrate 10 does not overlap with an orthographic projection of the concave structure of the first structural layer 3 on the substrate), the pixel definition layer includes a plurality of pixel definition structures 4, the light emitting component 2, which is defined by a dashed line block in FIG. 3, is provided between adjacent pixel definition structures 4, and a region between the adjacent pixel definition structures 4 defines the area of the orthographic projection of the light emitting component 2 on the substrate 10. It can be understood that boundaries of the respective layers of the light emitting component 2 define a boundary of the light emitting component 2.

It should be noted that, owing to the limitation of the process, the boundary of the light emitting component 2 defined by the concave structure of the first structural layer 3 is not so clear, in view of this, the pixel definition structures 4 are provided so as to define clearly the boundary of a light emitting pixel. More specifically, the pixel definition structures 4 are provided below a cathode 21, and cover edge position of at least part of the organic light emitting material layer, thus defining clearly the boundary of the light emitting component 2.

In an embodiment of the present disclosure, the light emitting component 2 includes the cathode 21, an anode 22 and an organic light emitting material layer 23. In some implementations, an electron transport layer and a hole transport layer are also provided between the cathode 21 and the anode 22.

In an embodiment of the present disclosure, the organic light emitting diode device is of a top-emission type, an encapsulation layer 5 is further provided on a side of the pixel definition structures 4 distal to the substrate 10, and spacers are provided between the pixel definition structures 4 and the encapsulation layer 5. The spacers are used for supporting the encapsulation layer 5.

The specific light emitting structure of the light emitting component 2 is not particularly limited in the present embodiment. The light emitting component 2 typically includes the cathode 21, the anode 22, and the original light emitting material layer 23 provided between the cathode 21 and the anode 22. Further, the light emitting component 2 may be a light emitting structure with more layers, e.g., it may include a hole injection layer (HIL), a hole transport layer (HTL), an light emitting material layer (EML), an electron transport layer (EFL), and an electron injection layer (EIL).

In an embodiment, the substrate 10 is further provided with a back-panel circuit thereon. The back-panel circuit typically includes a driving transistor and a switch transistor, wherein the drain 74 of the driving transistor is coupled to the anode 22 of the light emitting component 2 so as to control the light emitting component 2 to emit light. That is to say, a TFT is provided between the light emitting component 2 and the substrate 10. The TFT includes an active layer 71, a gate 72, a source 73 and a drain 74, and the drain 74 is coupled to the anode 22.

FIG. 3 of the present embodiment shows that a plurality of spacers 6 are provided on the pixel definition structures, and an encapsulation layer 5 covering the light emitting component 2 is provided on the plurality of spacers 6, wherein the encapsulation layer 5 may be made of glass, and encapsulate the light emitting component 2 into a sealed space. The encapsulation layer 5 is used to protect the organic light emitting material of the light emitting component 2 therein, and prevent external water and oxygen from entering the sealed space, thus further improving the product lifetime.

In an embodiment, a light adjustment component 8 is provided outside of the light emitting surface of the light emitting component 2, and is configured to convert light emitted from the light emitting component 2 into parallel light, and to emit the parallel light out.

In other words, the light adjustment component 8 is inserted in the encapsulation layer 5. In some implementations, the light adjustment component 8 may be provided on the encapsulation layer 5, or may be provided inside of the encapsulation layer 5. The light adjustment component 8 may be a lens formed by a nanoimprinting process. The lens is used to make the light emitted from the non-planar light emitting component 2 more uniform.

Figure 2A:
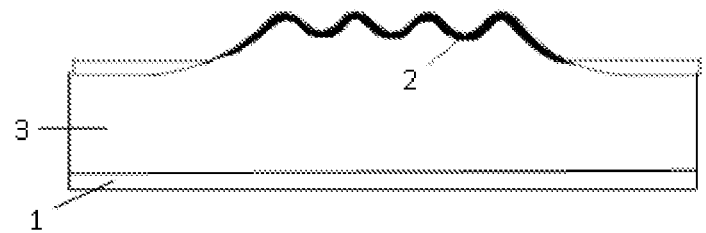

It should be noted that the OLED provided by the present embodiment is of top-emission type. It may be appreciated that an OLED of bottom-emission type with similar structure may be manufactured by reference to the above OLED of top-emission type. Such OLED of bottom-emission type may also improve the product lifetime with the aperture ratio of a pixel unchanged. Furthermore, the concave structure of the first structural layer 3 in the present embodiment recesses downwards, however, it may be appreciated that the concave structure may be provided as a similar structure which protrudes upwards, as shown in FIG. 2*a*. The light emitting component 2 formed on the basis of the first structural layer 3 with such an upwards-protruding structure also has a larger light emitting surface area, and also achieves the purpose of improving the product lifetime.

Figure 4:
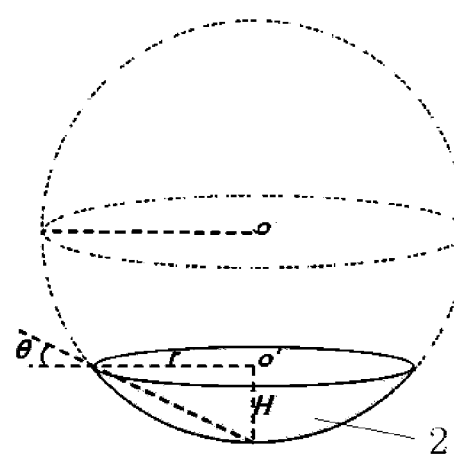

In an embodiment of the present disclosure, as shown in FIGS. 1, 3 and 4, the light emitting surface of the light emitting component 2 is a spherical-cap curved surface, a radius of a bottom circle of the spherical cap is r, a height of the spherical cap is H, wherein arctan(H/r) is an angle ranging from about 20° to about 40°.

It should be noted that, as shown in FIG. 4, a part of a spherical surface that is cut off by a plane is a spherical cap. As shown, a center point of the sphere is at O, a surface of the spherical cap is a curved surface which is a part of the spherical surface. The circle obtained by cutting the sphere is the bottom circle of the spherical cap. The center of the bottom circle is at O, and the radius of the bottom circle is r. A length of a segment, which is obtained by cutting a diameter of the sphere perpendicular to the cross section, of the diameter is a height H of the spherical cap. The radius r of the bottom circle and the height H of the spherical cap define a right triangle with two catheti r and H, and an angle faces the height H of the spherical cap is $\theta$, i.e., $\theta$=arctan(H/r). In the present embodiment, in a case where $\theta$ is smaller than 20° the lifetime of the light emitting product is improved to some extent; in a case where $\theta$ is larger than 20° the lifetime of the light emitting product is improved significantly; however, if $\theta$ is larger than 40°, a disconnection likely occurs in the cathode 21 in the upper layer of the light emitting component 2.

In the present embodiment, specific experimental data of three sets of spherical-cap light emitting components 2 are given. The acceleration factor n is set to 1.6 in the present embodiment. For the spherical cap of the first set, $\theta$ is 20°, the radius of the bottom circle of the spherical cap is r1, and the surface area of the spherical cap is S1; for the spherical cap of the second set, $\theta$ is 30°, the radius of the bottom circle of the spherical cap is r2, and the surface area of the spherical cap is S2; for the spherical cap of the third set, 0 is 40°, the radius of the bottom circle of the spherical cap is r3, and the surface area of the spherical cap is S3; wherein r1=r2=r3, and S1<S2<S A surface area S' of the light emitting surface of the light emitting component 2 in a comparison set is identical to the area S0 of the orthographic projection of the light emitting component 2 on the substrate 10. The pixel aperture ratio AR refers to a ratio of the area S0 of the orthographic projection of the light emitting component 2 on the substrate 10 to the area of a whole sub-pixel. A light emitting aperture ratio AR' refers to a ratio of the surface area S' of the light emitting surface to the area of a whole sub-pixel. The specific data for respective sets are shown in Table 1. R-AR, G-AR, and B-AR represent the pixel aperture ratios of a red sub-pixel, a green sub-pixel and a blue sub-pixel, respectively. L@400nit represents that an initial brightness of the light-emitting component 2 is 400 nit.

TABLE 1

| L@400 nit | S0 | S' | R-AR | G-AR | B-AR |
|---|---|---|---|---|---|
| Comparison set | S0 | S0 | 0.0469 | 0.0563 | 0.0751 |
| First set ($\theta$ = 20deg.) | S0 | S1 | 0.0469 | 0.0563 | 0.0751 |
| Second set ($\theta$ = 30deg.) | S0 | S2 | 0.0469 | 0.0563 | 0.0751 |
| Third set ($\theta$ = 40deg.) | S0 | S3 | 0.0469 | 0.0563 | 0.0751 |

The lifetimes LT95 (which can be evaluated by using a time by which the brightness of a light emitting component 2 is decreased to 95% of an initial brightness L0 thereof) of the spherical-cap light emitting components 2 in the three sets and the lifetime LT95 of the light emitting component 2 in the comparison set are tested using a brightness meter CA2000 (another similar brightness meter, such as PR788, may be used; the test results by another instrument are the same as the test results in the present embodiment). The test results are shown in Table 2, wherein R-AR', G-AR', and B-AR' represent the pixel aperture ratios of a red sub-pixel, a green sub-pixel and a blue sub-pixel, respectively. L@400nit represents that the initial brightness of the light-emitting component 2 is 400 nit.

TABLE 2

| L@400 nit | R-AR' | G-AR' | B-AR' | LT95(hrs) | Increasing rate of lifetime |
|---|---|---|---|---|---|
| Comparison set | 0.0469 | 0.0563 | 0.0751 | 250 | 100.0% |
| First set ($\theta$ = 20deg.) | 0.064 | 0.0768 | 0.1024 | 408 | 163.2% |
| Second set ($\theta$ = 30deg.) | 0.074 | 0.0888 | 0.1185 | 516 | 206.4% |
| Third set ($\theta$ = 40deg.) | 0.0863 | 0.1035 | 0.1381 | 660 | 264.0% |

It can be seen that: for the spherical cap of the first set, $\theta$ is 20°, and LT95 is increased to 163.2% as much as that of the comparison set; for the spherical cap of the second set, $\theta$ is 30°, and LT95 is increased to 206.4% as much as that of the comparison set; for the spherical cap of the third set, $\theta$ is 40°, and LT95 is increased to 264.0% as much as that of the comparison set, thus improvement of the lifetimes is significant.

Figure 5:
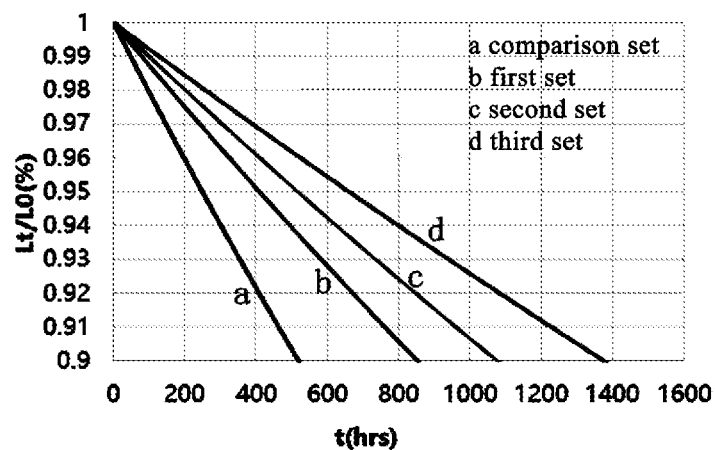
FIGS. 5 to 6 are comparison diagrams in which ratios of brightnesses of organic light emitting diode devices according to embodiments of the present disclosure to an initial brightness changes over time.
Figure 6:
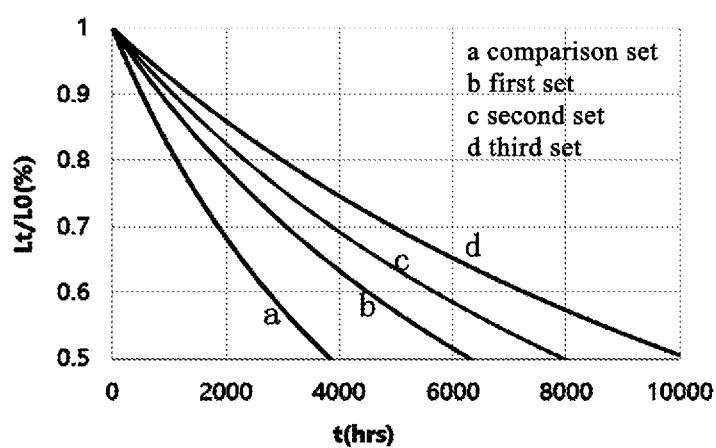

FIGS. 5 and 6 are comparison diagrams showing that the respective ratios of the brightnesses (Lt) of the spherical-cap light emitting components 2 in the three sets and the light emitting component 2 in the comparison set to the initial brightness (L0) change over time. FIG. 5 is a graph obtained in a case where the light emitting components 2 have emitted light for 1400 hours, and FIG. 6 is a graph obtained in a case where the light emitting components 2 have emitted light for 10000 hours, in FIG. 5 and FIG. 6, a graph represented by a lower-case letter "a" reflects a case of the comparison set, a graph represented by a lower-case letter "b" reflects a case of the first set, a graph represented by a lower-case letter "c" reflects a case of the second set, and a graph represented by a lower-case letter "d" reflects a case of the third set, From these figures it can be seen that, with the light-emitting time increasing, Lt/L0 of the third set is superior to that of the second set, Lt/L0 of the second set is superior to that of the first set, and Lt/L0 of the first set is superior to that of the comparison set.

It can be understood that, in a case where the light emitting surface of the light emitting component 2 is a concave-convex curved surface constituted by a plurality of spherical-cap curved surfaces. As shown in FIG. 2, the radius of the bottom circle of each of spherical-cap curved surfaces is r, the height of the spherical cap is H, and arctan (H/r) is an angle ranging from about 20° to about 40°. Thereby, it is possible to prevent the cathode in the upper layer of the light-emitting unit 2 from being disconnected while increasing the surface area of the light-emitting surface.

The sizes and the thicknesses of respective layers in the figures in the present embodiment are shown only in a schematic manner. In the practical process, projection areas of the respective layers on the substrate may be the same, or different, and so on, and other examples will not be listed here. The required projection areas of the respective layers may be achieved by etching processes; meanwhile, the geometric shapes of the respective layers of the structures are not particularly limited to those shown in the figures, and may also be achieved by etching.

Figure 7:
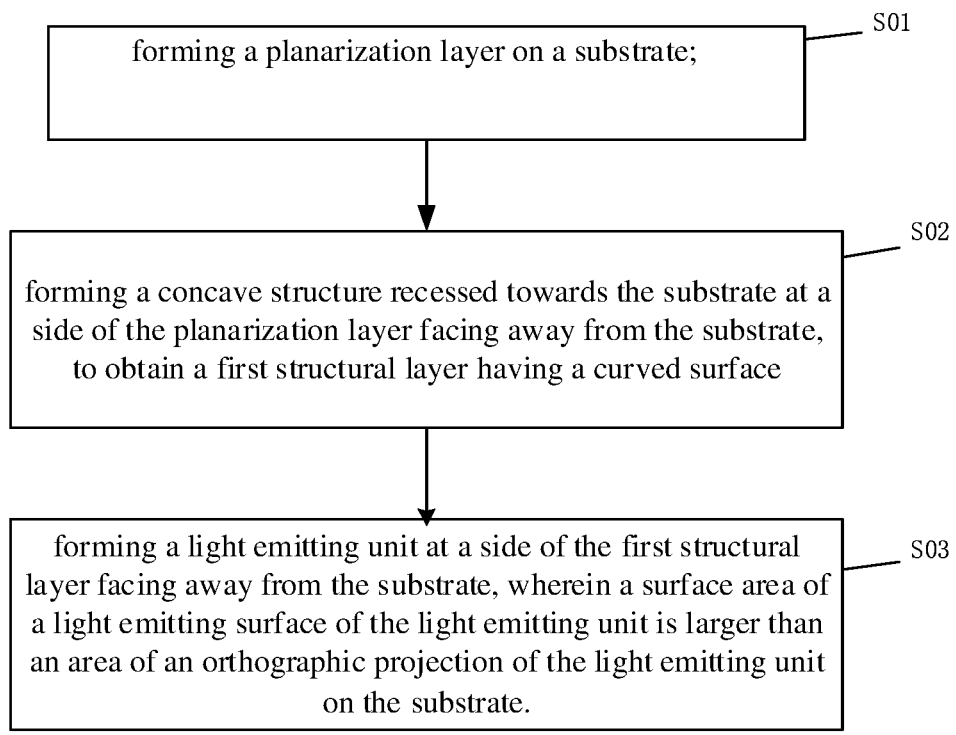
FIG. 7 is a flow chart of a method for manufacturing an organic light emitting diode device according to an embodiment of the present disclosure.

The present embodiment further provides a manufacturing method of an organic light emitting diode device. As shown in FIG. 7, the method includes the following steps:

S01, forming a planarization layer on a side of a substrate;

S02, forming a concave structure recessed towards the substrate on a side of the planarization layer distal to the substrate, to obtain a first structural layer having a curved surface; specifically, the concave structure formed in this step may be achieved by a process such as etching; and S03, forming a light emitting component on a side of the first structural layer distal to the substrate, wherein a surface area of a light emitting surface of the light emitting component is larger than an area of an orthographic projection of the light emitting component on the substrate.

The present embodiment provides a display panel which includes the organic light emitting diode device of the above embodiment.

Since the display panel of the present embodiment employs the organic light emitting diode device of the above embodiment, it has a high produce yield and a long produce lifetime.

The present embodiment provides a display device which includes the above display panel. The display device may be any product or component having a display function, such as an electronic paper, an OLED panel, a mobile, a tablet, a television, a display, a laptop, a digital photo frame, a navigator, and the like.

It will be appreciated that, the above implementations are exemplary implementations simply for illustrating the principle of the present disclosure. However, the present disclosure is not limited thereto. An ordinary person skilled in the art may make various modifications and variations without departing from the spirit and the protective scope of the present disclosure. These modifications and variations should be also considered as the protective scope of the present disclosure.

What is claimed is:

1. An organic light emitting diode device, comprising:
a substrate; and a light emitting component and a first structural layer provided on a side of the substrate,
wherein the light emitting component is provided on a side of the first structural layer distal to the substrate, and the side of the first structural layer distal to the substrate comprises a curved surface comprising a protruding portion protruding in a direction away from the substrate,
wherein the curved surface further comprises a concave-convex curved surface which is constituted by a plurality of spherical-cap curved surfaces within the protruding portion, and
wherein a surface of the light emitting component over the curved surface has a curved shape corresponding to the curved surface.

2. The organic light emitting diode device of claim 1, wherein a radius of a bottom circle of the spherical cap is r, a height of the spherical cap is H, and arctan(H/r) is an angle ranging from about 20° to about 40°.

3. The organic light emitting diode device of claim 1, wherein the curved surface and a surface of the light emitting component proximal to the first structural layer have a same shape and are in contact with each other.

4. The organic light emitting diode device of claim 1, wherein a thickness of the first structural layer in a direction perpendicular to the substrate ranges from 1 μm to 4 μm.

5. The organic light emitting diode device of claim 3, wherein the first structural layer is a planarization layer, a pixel definition layer is further provided at the side of the first structural layer distal to the substrate,
an orthographic projection of the pixel definition layer on the substrate does not overlap with an orthographic projection of a structure of the light emitting component on the substrate, the pixel definition layer comprises a plurality of pixel definition structures, the light emitting component is provided between adjacent pixel definition structures, and a region between the adjacent pixel definition structures defines the area of the orthographic projection of the light emitting component on the substrate.

6. The organic light emitting diode device of claim 5, wherein the organic light emitting diode device is of a top-emission type, an encapsulation layer is further provided on a side of the pixel definition structures distal to the substrate, and spacers are provided between the pixel definition structures and the encapsulation layer.

7. The organic light emitting diode device of claim 1, wherein the light emitting component comprises a cathode, an anode, and an organic light emitting material layer between the cathode and the anode.

8. The organic light emitting diode device of claim 7, wherein the light emitting component further comprises a hole injection layer, a hole transport layer, an electron transport layer and an electron injection layer.

9. The organic light emitting diode device of claim 8, wherein a thin film transistor is provided between the light emitting component and the substrate, the thin film transistor comprises an active layer, a gate, a source and a drain, and the drain is coupled to the anode.

10. The organic light emitting diode device of claim 1, wherein a light adjustment component is provided on a side of the light emitting component distal to the substrate, the light adjustment component is configured to refract light emitted from the light emitting component into light emitted in a single direction, and to emit the refracted light out.

11. The organic light emitting diode device of claim 5, wherein the organic light emitting diode device is of a top-emission type, an encapsulation layer is further provided on a side of the pixel definition structures distal to the substrate, and spacers are provided between the pixel definition structures and the encapsulation layer, a light adjustment component is provided inside of the light emitting component, the light adjustment component is configured to convert light emitted from the light emitting component into parallel light, and to emit the parallel light out.

12. The organic light emitting diode device of claim 10, wherein the light adjustment component comprises a lens.

13. The organic light emitting diode device of claim 11, wherein the light adjustment component comprises a lens.

14. A display panel, comprising an organic light emitting diode device, wherein the organic light emitting diode device is the organic light emitting diode device of claim 1.

15. A display panel, comprising an organic light emitting diode device, wherein the organic light emitting diode device is the organic light emitting diode device of claim 2.

16. A display device, comprising a display panel, wherein the display panel is the display panel of claim 14.

17. A manufacturing method of an organic light emitting diode device, comprising steps of:
    forming a first structural layer on a side of a substrate; and
    forming a light emitting component on a side of the first structural layer distal to the substrate;
    wherein a surface area of the side of the first structural layer distal to the substrate comprises a curved surface comprising a protruding portion protruding a direction away from the substrate,
wherein the curved surface further comprises a concave-convex curved surface which is constituted by a plurality of spherical-cap curved surfaces within the protruding portion, and
    wherein a surface of the light emitting component over the curved surface has a curved shape corresponding to the curved surface.

18. The manufacturing method of an organic light emitting diode device of claim 17, wherein
    the step of forming the first structural layer comprises steps of:
    forming a planarization layer on a side of a substrate; and
    forming a curved surface recessed towards the substrate on a side of the planarization layer distal to the substrate, to obtain the first structural layer.

* * * * *